(12) United States Patent
Boutaleb et al.

(10) Patent No.: US 12,278,155 B2
(45) Date of Patent: Apr. 15, 2025

(54) INTEGRATED CIRCUIT PACKAGE WITH HEAT SINK AND MANUFACTURING METHOD THEREOF

(71) Applicant: STMicroelectronics (Grenoble 2) SAS, Grenoble (FR)

(72) Inventors: Younes Boutaleb, Grenoble (FR); Fabien Quercia, Isere (FR); Asma Hajji, Voiron (FR); Ouafa Hajji, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 542 days.

(21) Appl. No.: 17/523,386

(22) Filed: Nov. 10, 2021

(65) Prior Publication Data

US 2022/0157683 A1    May 19, 2022

(30) Foreign Application Priority Data

Nov. 17, 2020    (FR) ...................................... 2011744

(51) Int. Cl.
*H01L 23/31* (2006.01)
*H01L 23/00* (2006.01)

(52) U.S. Cl.
CPC .......... *H01L 23/3142* (2013.01); *H01L 24/16* (2013.01); *H01L 24/32* (2013.01); *H01L 2224/16225* (2013.01); *H01L 2224/32225* (2013.01); *H01L 2224/73204* (2013.01)

(58) Field of Classification Search
CPC .................................................... H01L 23/3142
See application file for complete search history.

(56) References Cited

U.S. PATENT DOCUMENTS

| | | | |
|---|---|---|---|
| 2003/0168749 A1 | 9/2003 | Koike | |
| 2020/0020607 A1 | 1/2020 | Abd Hamid et al. | |
| 2020/0083136 A1* | 3/2020 | Dry | ........................ H01L 23/298 |

* cited by examiner

*Primary Examiner* — Samuel A Gebremariam
(74) *Attorney, Agent, or Firm* — Crowe & Dunlevy LLC

(57) ABSTRACT

A support substrate supports an electronic chip. An encapsulation coating on the support substrate coats the electronic chip. The encapsulation coating includes a trench surrounding the electronic chip. A heat sink is mounted to the encapsulation coating above the electronic chip. The heat sink is fixed to the encapsulation coating by an adhesive material and a thermal interface material layer is present between the electronic chip and the heat sink. The trench is positioned between the thermal interface material layer and the adhesive material.

18 Claims, 2 Drawing Sheets

INTEGRATED CIRCUIT PACKAGE WITH HEAT SINK AND MANUFACTURING METHOD THEREOF

PRIORITY CLAIM

This application claims the priority benefit of French Application for Patent No. 2011744, filed on Nov. 17, 2020, the content of which is hereby incorporated by reference in its entirety to the maximum extent allowable by law.

TECHNICAL FIELD

Embodiments and implementations relate to the packaging of integrated electronic devices, in particular packages for integrated circuits and more particularly packages including a heat sink ("lid"), for example small-size packages with an electronic flip chip, known to the person skilled in the art as a Flip Chip Compact Size Package (FCCSP).

BACKGROUND

An example of an integrated circuit package with heat sink of the prior art is shown in FIG. 1.

This package comprises a support substrate 2 supporting an electronic flip chip 5.

More particularly, the chip 5 here includes connections 6 formed of solder bumps allowing it to be electrically connected to the metal tracks of the support substrate 2.

The support substrate 2 indeed includes an interconnection network which allows the connections 6 of the chip 5 to be connected to the connections 3 allowing the support substrate 2 to be connected to a printed circuit board.

These connections 3 may, for example, be a ball array.

The electronic chip 5 is embedded in an encapsulation coating 4 located on the support substrate 2.

The face of the electronic chip 5, opposite to that including the connections 6, is covered with a layer 7 of a thermal interface material (TIM).

The package 1 also includes a heat sink (lid) 8 covering on the one hand the thermal interface material layer 7 and fixed on the other hand on the upper face of the coating 4 by an adhesive material 9, for example a bead of glue.

However, such a structure has some disadvantages.

Indeed, when mounting the heat sink 8, part of the thermal interface material may spread out and come into contact with the adhesive glue 9, which may raise problems of chemical incompatibility.

One solution to reducing this risk of spreading of the thermal interface material may be not to exert too much pressure on the heat sink 8 when mounting it. But, in this case, such a solution can lead to the formation of a thermal interface material layer having a greater thickness than necessary, which then leads to a greater thermal resistance of the thermal interface material and therefore to less efficient heat dissipation.

There is therefore a need to provide a more satisfactory solution to this problem.

SUMMARY

According to one implementation and embodiment, provision is made of a new package structure which limits, or even eliminates, the risk of spreading of the thermal interface material on the coating so as to limit, or even eliminate, the risk of mixing with the adhesive material fixing the heat sink to the coating.

According to one implementation and embodiment, provision is also made of a new package structure allowing for better control of the thickness of the thermal interface material layer leading to a reduction in the thermal resistance of this layer and consequently improved heat dissipation.

According to one aspect, an integrated circuit package comprises: a support substrate supporting an electronic chip; a coating located on the support substrate and coating said electronic chip; a heat sink located above said electronic chip and above at least part of said coating and fixed on said coating by an adhesive material; and a thermal interface material layer located between the electronic chip and the heat sink.

In this package, the coating advantageously includes at least a first trench surrounding said chip and located between the thermal interface material layer and the adhesive material.

Thus, this first trench forms an obstacle to the spreading of the thermal interface material and helps to limit the risk of this thermal interface material mixing with the adhesive material.

Furthermore, the control of the thickness of the thermal interface material layer is improved, and this thickness can be reduced compared to a package of the prior art, because even if the reduction of this thickness leads to an overflow of a part of the thermal interface material beyond the chip, this overflowing part may possibly flow into the first trench without coming into contact with the adhesive material.

Even if this first trench is present in the coating, it is possible that in some cases part of the thermal interface material may not flow into this trench. However, in other cases, the first trench may contain part of the thermal interface material, which will have spread when mounting the heat sink.

The first trench is advantageously continuous (for example, in a ring shape surrounding the chip) and is preferably located in the vicinity of the outer peripheral edge of the electronic chip.

According to one embodiment, it is particularly advantageous for the coating to further include a second trench located around the first trench and containing at least part of the adhesive material.

Thus, this second trench aims at containing the adhesive material and consequently contributes, with the first trench, even more to avoiding mixing of the thermal interface material and the adhesive material when mounting the heat sink on the coating.

The second trench could also be continuous (for example, in a ring shape surrounding the first trench), but in practice it can be discontinuous.

The second trench is, for example, located in the vicinity of a peripheral edge of the heat sink.

According to another aspect, provision is made of a method for making an integrated circuit package.

This method comprises: fixing an electronic chip on a support substrate; making a coating on the support substrate coating the electronic chip; forming in said coating a first trench surrounding said chip; forming a thermal interface material layer on the electronic chip; and mounting a heat sink extending above the thermal interface material layer and fixed on the support substrate by means of an adhesive material, the first trench being located between the electronic chip and the adhesive material.

The first trench is advantageously continuous and preferably located in the vicinity of the electronic chip.

According to one implementation, the method further comprises forming in said coating a second trench, which is for example discontinuous and advantageously located in the vicinity of a peripheral edge of the heat sink, this second trench being located around the first trench.

The method according to this implementation then comprises filling the second trench with the adhesive material overflowing from the opening of this second trench, and mounting the heat sink extending above the thermal interface material layer and the second trench so as to be fixed on said coating by means of the adhesive material.

BRIEF DESCRIPTION OF THE DRAWINGS

Other advantages and features of the invention will become apparent upon examining the detailed description of embodiments and implementations, which are in no way limiting, and the appended drawings wherein.

DETAILED DESCRIPTION

Figure 2:
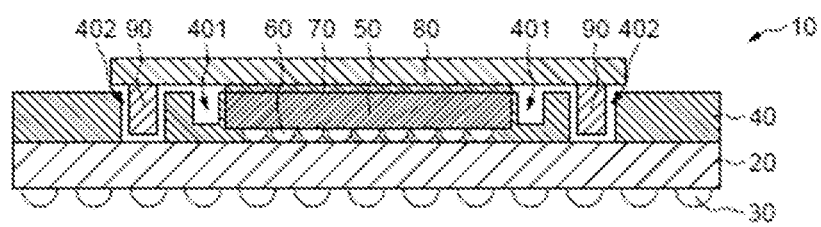
FIG. 2 shows an integrated circuit package with heat sink in accordance with embodiments herein.

In FIG. 2, the reference 10 designates a package including a support substrate 20 equipped on one of its faces with electrical connections 30 allowing this support substrate to be connected, for example, to a printed circuit board, and supporting on its other face the front surface of an integrated circuit chip 50 in a flip chip orientation.

This chip 50 is electrically connected to metal tracks of the support substrate by connections 60 such as bumps.

The package 10 also includes an encapsulation coating 40, for example made of resin, located on the support substrate and coating the electronic chip 50.

The rear surface of the electronic chip 50 is also covered with a thermal interface material (TIM) layer 70 of a composition well known to the person skilled in the art.

By way of non-limiting example, use can be made, for example, of the material for the TIM layer 70 from the company DOW known under the name "DOWSIL DA 6534" which is a conductive adhesive having high thermal conductivity.

The package 10 also includes a heat sink 80 located above the thermal interface material layer 70 and above the coating 40 and fixed on this coating 40 by means of an adhesive glue 90 housed in a second trench 402.

Such an adhesive glue is conventional and well known to the person skilled in the art.

Figure 3:
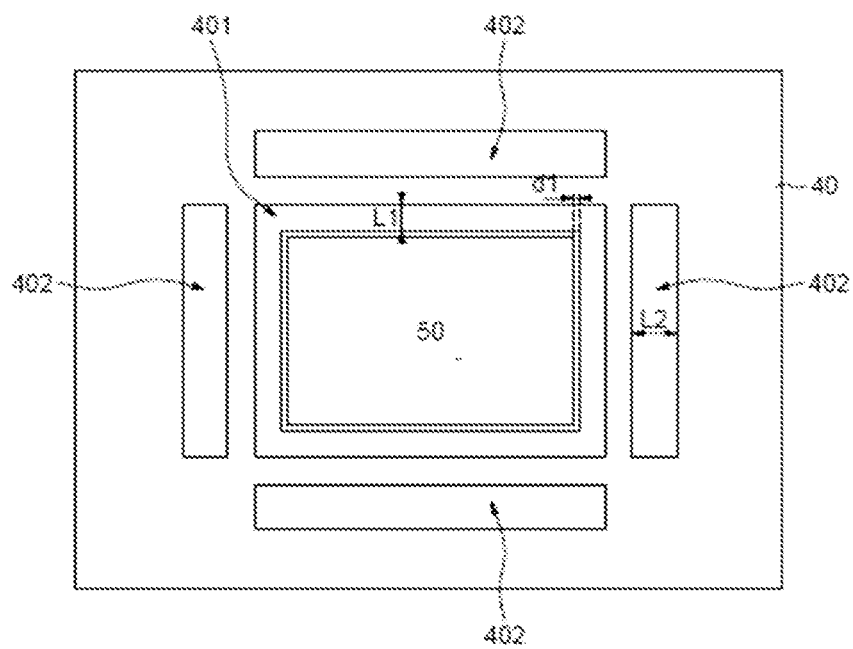
FIG. 3 is a top view of a part of the integrated circuit package shown in FIG. 2.

FIG. 3 shows a top view of the package of FIG. 2 wherein the heat sink and the thermal interface material layer are not shown.

It can be seen that the coating 40 includes a first trench 401 formed around the electronic chip 50 in the vicinity thereof, as well as the second trench 402 mentioned above. The first trench 401 has a depth, for example, of the order of 50 micrometers and a width L1 of 100 micrometers.

This first trench 401 is located at a distance d1 from the chip 50 which may be comprised between 50 micrometers and 100 micrometers.

It can be seen that this first trench 401 is continuous (for examine in the shape of a ring) and completely surrounds the chip 50.

The second trench 402 is here, in turn, discontinuous and formed of four portions. The width L2 of each portion is of the order of 250 micrometers and the depth of each portion is of the order of 75 micrometers.

The second trench 402 is located in the vicinity of a peripheral edge of the heat sink.

It can be seen that the first trench 401 will act as an obstacle for the possible spreading of the thermal interface material when mounting the heat sink.

Figure 8:
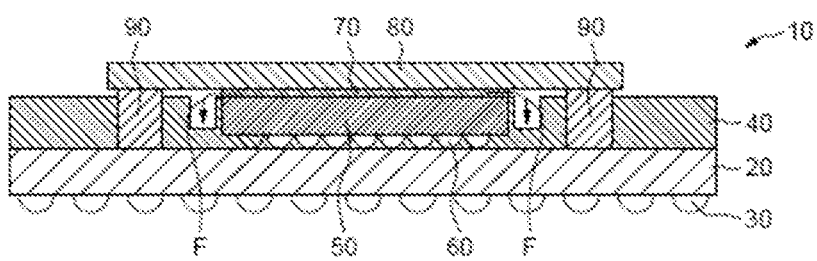

In this regard, the first trench 401 may ultimately contain a part of the thermal interface material TIM which will have spread slightly when mounting the heat sink, as shown by the arrow F in FIG. 8.

Due to the presence in particular of this first trench 401, the thickness of the layer 70 of the thermal interface material can be more easily controlled.

Figure 1:
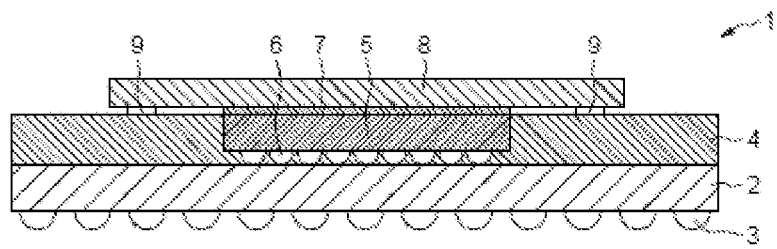
FIG. 1 shows an integrated circuit package with heat sink of the prior art.

In this regard, while in the prior art for a package of the type of that illustrated in FIG. 1, it was possible to obtain a thickness of the thermal interface material layer of the order of 75 micrometers, it is possible, according to the invention, to reduce this thickness to approximately 50 micrometers, which allows a reduction of approximately 33% in the thermal resistance to be obtained compared to the thermal resistance of the package of FIG. 1.

Reference is now made more particularly to FIGS. 4 to 8 to illustrate an example of a method for manufacturing a package of the type of that of FIG. 2.

Figure 4:
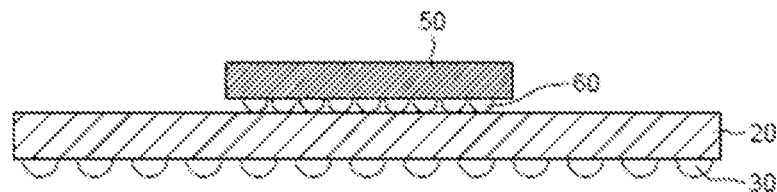
FIGS. 4-8 show steps in a method of manufacturing the integrated circuit package shown in FIG. 2.

FIG. 4 shows the support substrate 20 equipped with its connections 30 as well as the chip 50 which is flipped and electrically connected on the support substrate by the connections 60.

Figure 5:
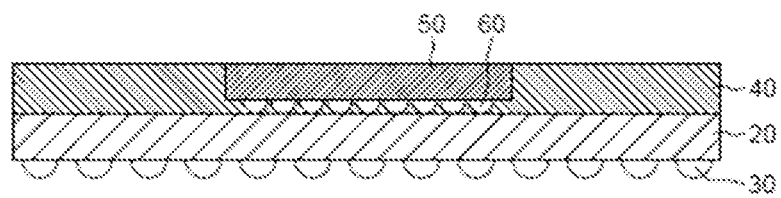

In FIG. 5, the encapsulation coating 40 which coats the electronic chip 50 is formed in a conventional manner known per se, typically by molding.

Figure 6:
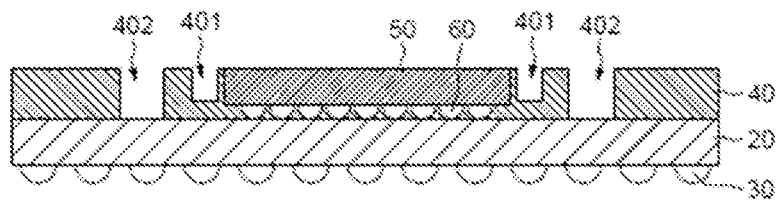

Then, in FIG. 6, in the coating 40, the first trench 401 is formed around the chip 50 and the second trench 402 around the first trench 401.

These trenches can be made, for example, by local laser ablation of the coating or by partial mechanical digging of the coating.

Figure 7:
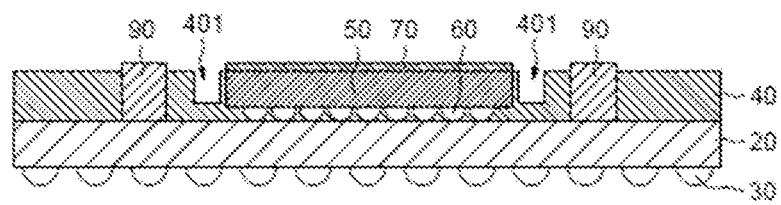

Then, as illustrated in FIG. 7, the thermal interface material layer 70 is deposited on the chip 50 and the adhesive glue 90 is deposited in the second trench 402 so that it fills this trench 402, by overflowing slightly above its orifice so as to allow, as illustrated in FIG. 8, the fixing of the heat sink 80 when it is mounted above the thermal interface material layer 70.

The invention claimed is:

1. An integrated circuit package, comprising:
   a support substrate supporting an electronic chip;
   an encapsulation coating located on the support substrate and coating said electronic chip;
   wherein the encapsulation coating includes a first trench that is continuous and surrounds said electronic chip and a second trench spaced apart from the first trench, and wherein the first trench is positioned between the second trench and the electronic chip;
   a heat sink located above said electronic chip and above at least part of said encapsulation coating and fixed to said encapsulation coating by an adhesive material contained at least partially within said second trench; and
   a layer of thermal interface material located between the electronic chip and the heat sink.

2. The package according to claim 1, wherein the first trench is configured to contain excess thermal interface material from said layer.

3. The package according to claim 1, wherein the first trench is located in a vicinity of an outer peripheral edge of the electronic chip.

4. The package according to claim 1, wherein the second trench is discontinuous.

5. The package according to claim 1, wherein the second trench is located in a vicinity of a peripheral edge of the heat sink.

6. An integrated circuit package, comprising:
a support substrate;
an electronic chip mounted to a first surface of the support substrate;
an encapsulation coating covering the first surface configured to encapsulate side edges of the electronic chip;
a first trench having a depth less than a thickness of the encapsulation coating and extending parallel to the side edge of the electronic chip;
a second trench extending parallel to the first trench and completely through the thickness of the encapsulation coating to reach the first surface of the support substrate;
wherein the first trench is located between the first trench and the side edge of the electronic chip;
a heat sink located above said electronic chip and above at least part of said encapsulation coating;
wherein the heat sink is fixed to said encapsulation coating by an adhesive material positioned within the second trench.

7. The package according to claim 6, further comprising a layer of thermal interface material located between an upper surface of the electronic chip and an underside surface of the heat sink.

8. The package according to claim 6, wherein the adhesive material positioned within the second trench overflows into the first trench.

9. The package according to claim 6, wherein the first trench continuously and completely surrounds the electronic chip.

10. The package according to claim 6, wherein the second trench discontinuously surrounds the electronic chip.

11. The package according to claim 6, wherein a portion of the encapsulation coating is positioned between the first trench and the side edges of the electronic chip.

12. The package according to claim 6, wherein a portion of the encapsulation coating is positioned between the first trench and the second trench.

13. An integrated circuit package, comprising:
a support substrate supporting an electronic chip;
an encapsulation coating located on the support substrate and encapsulating said electronic chip, said encapsulation coating including a first trench surrounding said electronic chip and a second trench located around the first trench;
a heat sink located above said electronic chip and above at least a portion of said encapsulation coating;
wherein the heat sink is attached to said encapsulation coating by an adhesive glue contained at least in part within the second trench; and
a layer of a thermal interface material located between the electronic chip and the heat sink;
wherein the first trench is located between the layer of thermal interface material and second trench containing the adhesive glue.

14. The integrated circuit package of claim 13, wherein the first trench contains a portion of the adhesive glue.

15. The integrated circuit package of claim 13, wherein the first trench is continuous.

16. The integrated circuit package according to claim 13, wherein the first trench is located in the vicinity of the electronic chip.

17. The integrated circuit package according to claim 13, wherein the second trench is discontinuous.

18. The integrated circuit package according to claim 13, wherein the second trench is located in the vicinity of a periphery of the heat sink.

* * * * *